(12) United States Patent
Haensgen et al.

(10) Patent No.: US 6,611,137 B2
(45) Date of Patent: Aug. 26, 2003

(54) HALL EFFECT CURRENT SENSOR SYSTEM PACKAGING

(76) Inventors: Steven T. Haensgen, 8170 Lauree La., Oak Creek, WI (US) 53154; Jeffrey R. Annis, 544 W. 25680 Underwoot Ct., Waukesha, WI (US) 53189; Gary L. Lehman, 13421 W. Prospect Dr., New Berlin, WI (US) 53151

( * ) Notice: Subject to any disclaimer, the term of this patent is extended or adjusted under 35 U.S.C. 154(b) by 0 days.

(21) Appl. No.: 10/172,884

(22) Filed: Jun. 17, 2002

(65) Prior Publication Data

US 2002/0167301 A1 Nov. 14, 2002

Related U.S. Application Data

(62) Division of application No. 09/406,508, filed on Sep. 28, 1999, now Pat. No. 6,426,617.

(51) Int. Cl.[7] .................................................. G01R 31/00
(52) U.S. Cl. ........................... 324/117 H; 324/117 R
(58) Field of Search ............................ 324/117 R, 251, 324/252, 127, 500, 126; 338/32 H (56) References Cited

U.S. PATENT DOCUMENTS

| 4,059,798 A | 11/1977 | Dierker et al. | 324/127 |
|---|---|---|---|
| 4,414,543 A | 11/1983 | Schweitzer, Jr. | 340/651 |
| 4,894,610 A | 1/1990 | Friedl | 324/127 |
| 5,041,761 A | 8/1991 | Wright et al. | 315/129 |
| 5,146,156 A | 9/1992 | Marcel | 324/127 |
| 5,436,557 A | 7/1995 | Erickson | 324/117 |
| 5,530,937 A | 6/1996 | Sugiyama | 372/38 |
| 5,544,046 A | 8/1996 | Niwa | 364/474.01 |
| 5,583,429 A | 12/1996 | Otaka | 324/127 |
| 5,694,103 A | 12/1997 | Goodwin et al. | 336/178 |
| 6,005,383 A | 12/1999 | Savary et al. | 324/117 |

FOREIGN PATENT DOCUMENTS

EP   0 552 066 A1   1/1993   ............ H01R/13/66

Primary Examiner—Vinh P. Nguyen (57) ABSTRACT

A Hall effect current sensor system for use in, for example, a relay. The system also includes a core having a central opening for receiving the conductor therethrough. The core further includes a gap sized to receive a Hall generator. The Hall generator and the core are mounted to a first printed circuit board. This circuit board also has an opening to receive the conductor therethrough. The first printed circuit board is electrically and mechanically connected to a second printed circuit board by a board-in-board connection.

6 Claims, 9 Drawing Sheets

HALL EFFECT CURRENT SENSOR SYSTEM PACKAGING

This application is a division of Ser. No. 09/406,508 filed Sep. 28, 1999, now U.S. Pat. No. 6,426,617.

FIELD OF THE INVENTION

The present invention relates generally to the packaging of current sensor systems for use in components, such as relays utilized with motor control systems, and particularly to Hall effect current sensors packaged to provide optimum performance and dependability while minimizing the effects of extraneous influences, such as electrical noise.

BACKGROUND OF THE INVENTION

A variety of sensors are used to measure the amount of current flowing through a conductor. One such example is a Hall effect current sensor that measures current flowing through a conductor and provides an output signal proportional to the level of current. Hall effect current sensors offer several advantages over traditional current transformers such as a more compact size, higher current levels for a given size, and a larger frequency bandwidth.

Some Hall effect current sensors include a ferrous-based core that surrounds a conductor and a Hall generator. In fact, there are several approaches to constructing and packaging Hall effect current sensor devices. In one approach, a donut or toroidal-shaped ferrite core is provided with a cut slot that is positioned over a Hall effect chip vertically mounted on and soldered to a circuit board. The ferrite core is manually positioned relative to the Hall effect chip and glued to the circuit board. In another approach, a donut-shaped ferrite core, soldered Hall effect chip, and circuit board are placed inside a housing. The components are secured inside the housing with an epoxy potting compound that completely fills the entire housing cavity. The components are then oven-baked for several hours to cure the epoxy.

According to another approach, an overlapping lamination stack is inserted into a bobbin which contains a Hall effect chip soldered to a circuit board. The circuit board, bobbin, Hall effect chip, and lamination subassembly are secured within a two-piece housing. Right angle pin connectors are soldered to the same circuit board as the Hall effect chip and are utilized as a means to mechanically and electrically connect the Hall effect current sensor module to a primary circuit board.

Each of the above-described systems suffers from one or more drawbacks. For example, positioning of a Hall effect chip relative to a gapped core is difficult when utilizing manual gluing and locating techniques. In other approaches, the use of right angle pin connectors tends to provide a mechanically insecure connection that is subject to breakage under the shock and vibration levels experienced in industrial controls environments. Also, such right angle pin connectors can be bent easily, creating difficulty in assembly. In other approaches, the manual labor of placing a core, potting a core, and gluing the core to a circuit board is an inefficient and expensive manufacturing process. Additionally, the required curing cycle reduces production through-put and adds significant cost to the sensor. These and other drawbacks reflect a need for a more reliable and cost effective system for packaging Hall effect sensor devices that are used in a variety of industrial environments, e.g. relays utilized in motor control systems.

It would be advantageous to utilize a Hall effect sensor package that permitted use of an open-loop system in which the voltage signal output from the Hall generator could be directly used to sense or measure current.

SUMMARY OF THE INVENTION

The present invention features a Hall effect current sensor system. The system comprises a Hall generator and a core having a central opening sized to receive a current conductor therethrough. The core also includes a gap designed to receive the Hall generator. The Hall generator and the core are mounted to a first printed circuit board. The circuit board also has an opening to receive the conductor therethrough. The first printed circuit board is electrically and physically connected to a second printed circuit board. The circuit boards are arranged such that the axis of the central opening is generally parallel with the second printed circuit board.

According to another aspect of the invention, a current sensor system is provided for use in a motor control environment to sense current and to provide a corresponding output. The system comprises a primary printed circuit board, a core and a sensor. The core is formed from a lamination stack having a plurality of laminations lying generally parallel to a common plane. The common plane is generally perpendicular to the primary printed circuit board. The core includes a conductor opening for receiving a conductor therethrough and a gap extending through the lamination stack. The sensor is disposed in the gap to detect a magnetic flux in the core and to output a corresponding signal. The core is grounded to the primary printed circuit board to reduce or eliminate the effects of electrical noise on the conductor.

According to another aspect of the invention, a Hall effect current sensor system is provided. The system includes a first circuit board to which a Hall generator is electrically connected. The system further includes a primary circuit board electrically coupled to the first circuit board. The primary circuit board has a pair of surfaces and a perimeter edge. The system also includes a core having a gap that is sized to receive the Hall generator therebetween. The core further includes a conductor opening through which a conductor extends. The axis of the conductor opening is generally parallel with the pair of surfaces.

BRIEF DESCRIPTION OF THE DRAWINGS

The invention will hereafter be described with reference to the accompanying drawings, wherein like reference numerals denote like elements, and.

DETAILED DESCRIPTION OF THE PREFERRED EMBODIMENTS

Figures 1, 2, 3:
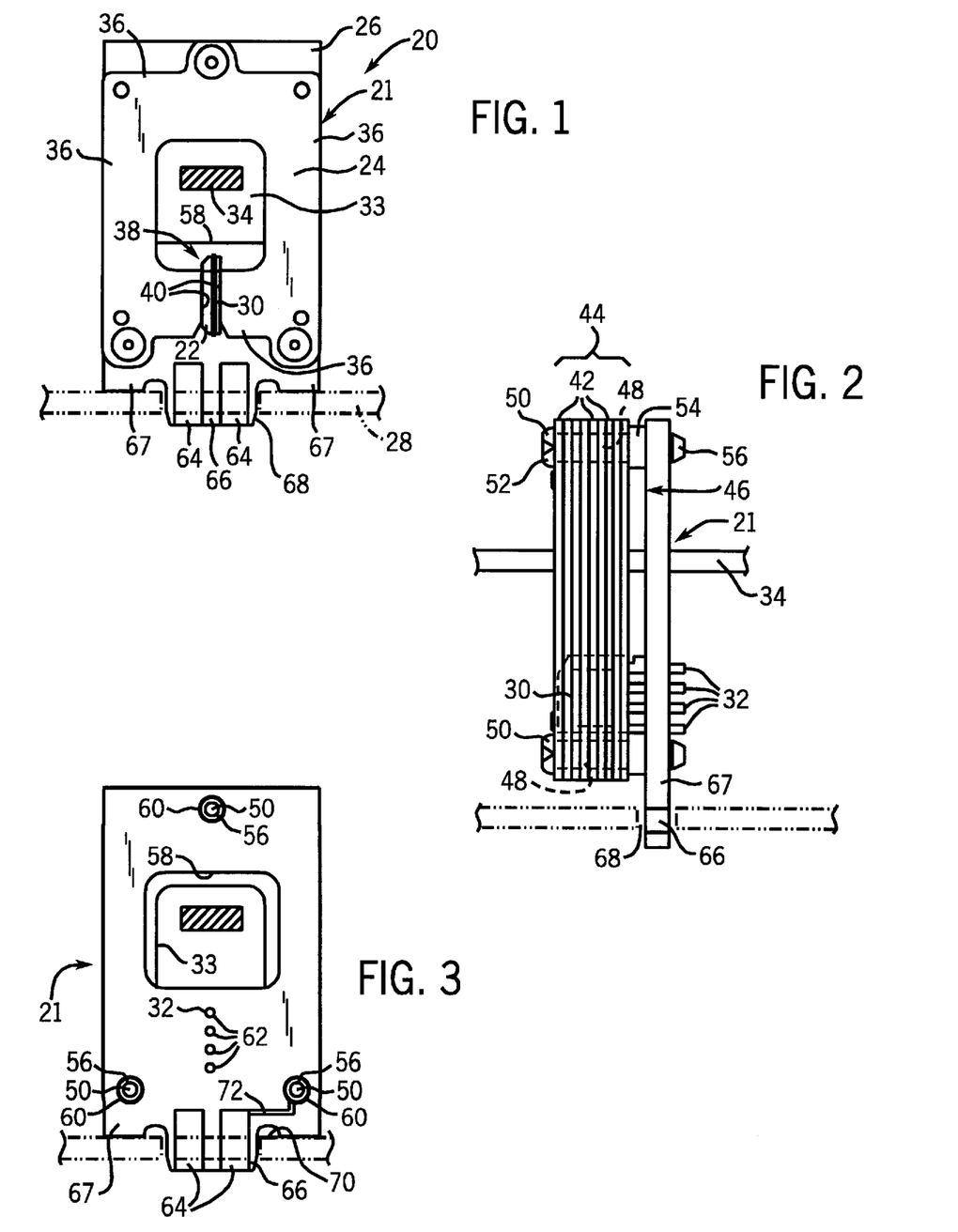
FIG. 1 is a front view of a current sensor system, according to a preferred embodiment of the present invention.
FIG. 2 is a side view of the system illustrated in FIG. 1.
FIG. 3 is a rear view of the system illustrated in FIG. 1.

Referring generally to FIGS. 1 through 3, an exemplary embodiment of a sensor system 20 is illustrated. A preferred sensor system is a Hall effect current sensor system. In this preferred embodiment, the sensor system 20 includes a sensor module 21, having a sensor 22, such as a Hall generator, a core 24, and a supporting printed circuit board 26 to which Hall generator 22 and core 24 are mounted, and a primary circuit board 28 to which module 21 is mechanically and electrically connected. Specifically, printed circuit board 26 is mechanically and electrically connected to primary printed circuit board 28. Primary printed circuit board 28 is designed for the particular environment in which sensor system 20 is utilized. For example, sensor system 20 may be utilized in motor control environments, and specifically in relays designed to monitor and, if necessary, interrupt current passing through one or more conductors.

Sensor 22 preferably is a Hall generator that includes a Hall plate 30 and a plurality of leads 32 that are coupled to printed circuit board 26. Hall generator 22 outputs a signal, and specifically a voltage signal, that corresponds to the magnetic flux in core 24, which is proportional to the current flowing through a conductor 34. The signal is output through appropriate leads 32.

In the illustrated embodiment, core 24 is formed as a rectangular ring that defines a central opening 33 through which the conductor 34 passes. Current in conductor 34 creates a magnetic flux in core 24 and across a gap 38 that is sensed by sensor 22. As described above, a corresponding voltage signal is output through appropriate leads 32 as an indication of the current level in conductor 34.

In the exemplary embodiment illustrated, core 24 is generally rectangular in shape, e.g. square, having four sides 36. The side 36 proximate primary printed circuit board 28 is interrupted by gap 38 sized to receive sensor 22 therein. Gap 38 is defined by a pair of core ends or core faces 40 that face one another across a space sufficient to receive Hall generator 22.

Preferably, core 24 is formed of a plurality of laminations 42 that are made from a ferrous-based material, such as high permeability nickel-iron. The laminations 42 are stacked to form a lamination stack 44 which is mounted to printed circuit board 26. Preferably, laminations 42 and printed circuit board 26 all lie generally parallel to a common plane.

Lamination stack 44 may be mounted to printed circuit board 26 in a variety of ways, but it preferably is spaced from printed circuit board 26 a predetermined distance indicated by reference numeral 46. In the illustrated embodiment, lamination stack 44 includes a plurality of openings 48 for receiving mounting pins or rivets 50 therethrough. For example, three pins 50 may be used to hold lamination stack 44 to printed circuit board 26. Each pin 50 maintains lamination stack 44 between a pin head 52 and a shoulder 54. Shoulders 54 are disposed between pin head 52 and the distal end 56 of each pin 50. The shoulders are designed to maintain distance 46 between lamination stack 44 and printed circuit board 26. The space helps prevent the lamination stack 42 from shorting the Hall generator 22 to solder pads on the printed circuit board 26, and from wearing the solder mask. The space also facilitates centering of the Hall plate 28 within the core gap.

Printed circuit board 26 may be generally rectangular in shape and includes a central opening 58 that is generally aligned with central opening 33 of core 24. This allows conductor 34 to freely pass through central opening 33 of core 24 and central opening 58 of printed circuit board 26 without contacting either component. As illustrated, printed circuit board 26 generally is perpendicular to primary printed circuit board 28, and conductor 34 extends generally parallel with primary printed circuit board 28 as it passes through openings 33 and 58.

Circuit board 26 further includes a plurality of apertures 60 for receiving distal ends 56 of mounting pins 50. Distal ends 56 may be secured within aperture 60 by bonding, soldering or other techniques known to those of ordinary skill in the art. Printed circuit board 26 also includes a plurality of receptacles 62 for receiving leads 32 to form an electrical connection with Hall generator 22. It should be noted that receptacles 62 may take other forms, e.g. pads.

Additionally, printed circuit board includes a plurality of pads 64 by which leads 32 are electrically connected to primary circuit board 28. Leads 32 are connected to pads 64 through appropriate traces/circuits contained in circuit board 26.

Pads 64 are disposed on a circuit board tab 66 that extends outwardly from the remainder of circuit board 26. Tab 66 is designed for receipt in a corresponding opening 68 of primary circuit board 28 to create a mechanical connection that maintains circuit board 26 in a generally perpendicular orientation with respect to primary circuit board 28. Circuit board 26 also includes a pair of standoffs 67 adjacent tab 66 to maintain the core 24 at a given distance above primary circuit board 28. The distance helps avoid mechanical and electrical interference from components mounted on board 28.

Pads 64 are soldered to appropriate pads or connectors disposed in primary printed circuit board 28 to form the electrical connection between the two circuit boards. This type of connection is commonly referred to as a board-in-board connection by which the two circuit boards may be mechanically and electrically connected to one another. This arrangement provides a secure and durable connection even when sensor system 20 is utilized in relatively harsh, industrial environments subject to shock and vibration inputs.

The arrangement of components in the Hall effect current sensor system 20 is selected to minimize electrical noise that can effect the signal output by Hall generator 22 and to provide a sturdy package for use in a wide variety of industrial applications. To reduce or eliminate the effects of noise on conductor 34, core 24 preferably is electrically connected to a ground 70. (See FIG. 3). Ground 70 can either be a protective "earth" ground or a circuit ground. For example, core 24 may be grounded through one of the pins 50 that is electrically connected to ground 70 via a trace 72 connected to an appropriate pad 64 which, in turn, is connected to ground 70.

The grounding of core 24 has no detrimental effects with respect to the magnetic properties or characteristics of the core 24. However, the grounding substantially reduces or eliminates the effects of electrical noise that can be capacitively coupled from conductor 34 to a floating core, such as core 24. Absent the grounding to ground 70, the electrical noise can be capacitively coupled to Hall generator 22 due to the significant amount of surface area that core end surfaces 40 have in parallel with Hall plate 30 of Hall generator 22.

Additionally, Hall plate 30 and Hall generator 22 preferably are positioned such that they are relatively immune from direct electrical noise on either conductor 34 or primary printed circuit board 28. This is accomplished by positioning Hall plate 30 in a generally perpendicular orientation with respect to the electrical fields radiated from conductor 34 towards Hall generator 22, as best viewed in FIG. 1. Preferably, Hall plate 30 also is disposed generally perpendicular to primary printed circuit board 28, and thus is less influenced by electrical fields created by various components that may be mounted on primary printed circuit board 28.

Furthermore, the accuracy of the voltage signal output through leads 32 is increased by properly locating Hall plate 30 with respect to core end surfaces 40. Specifically, it is preferred that Hall plate 30 be generally centered with respect to the surface area of core end surfaces 40. For example, Hall plate 30 is vertically centered with respect to surfaces 40, as illustrated in FIG. 1. Additionally, Hall plate 30 is axially centered with respect to surfaces 40, as illustrated in FIG. 2.

Figure 4:
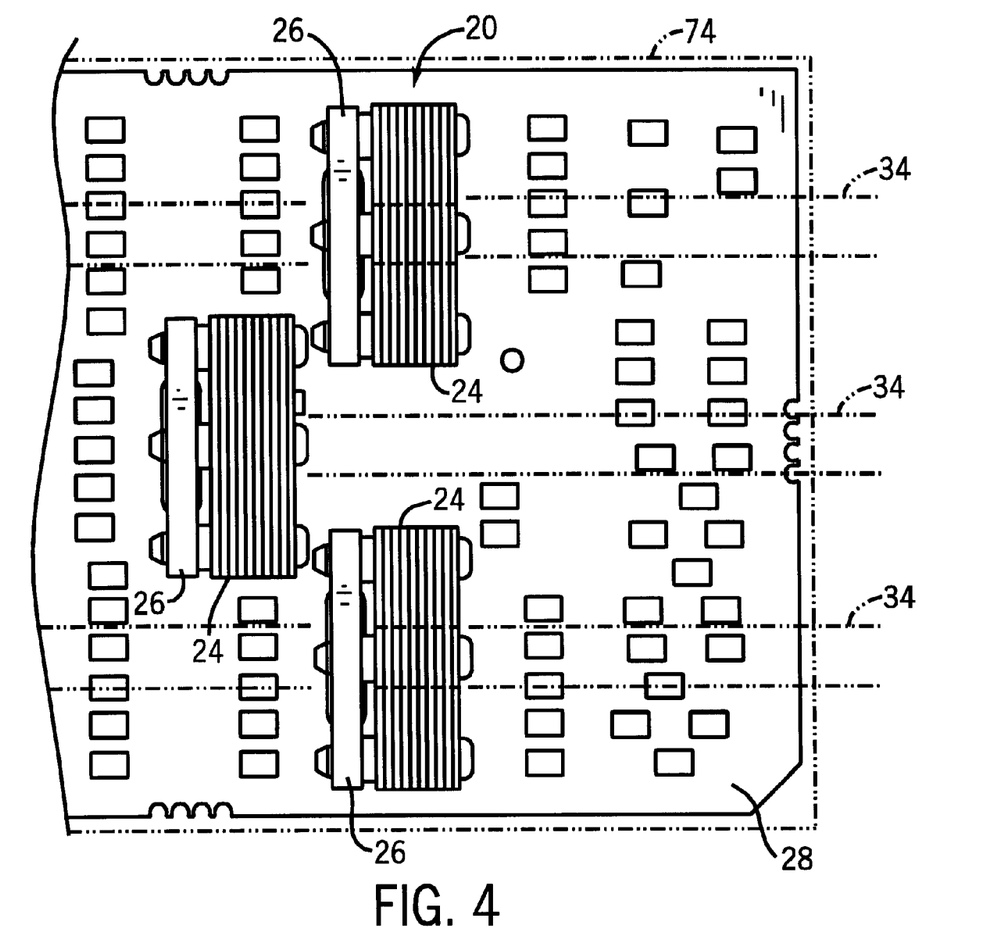
FIG. 4 is a top view of a system similar to that illustrated in FIG. 1 and designed for sensing current in a plurality of conductors.
Figure 5:
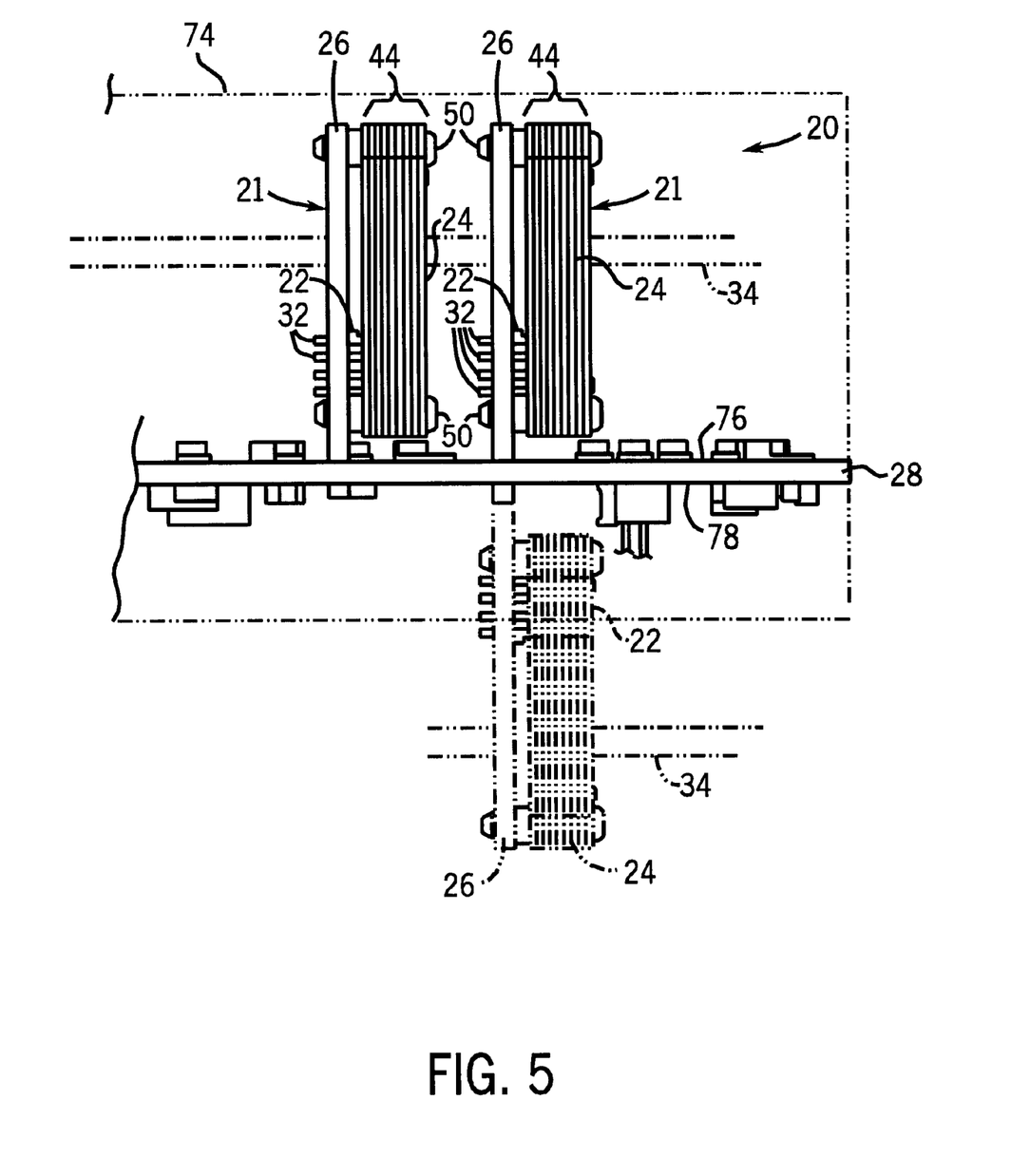
FIG. 5 is a front view of the system illustrated in FIG. 4.

Referring generally to FIGS. 4 and 5, sensor system 20 may include a plurality of cores 24 and sensors 22. For example, sensor system 20 may be utilized in a motor control component 74, such as a relay indicated in dashed lines in FIGS. 4 and 5. Such relays are used to automatically interrupt power or stop a given process if current flow through a conductor is abnormal. Such a relay typically is used in conjunction with a three-phase power supply in which three conductors 34 are used. In this system, a separate core 24, sensor 22, and printed circuit board 26 is used for each conductor 34.

The printed circuit boards may be arranged in staggered formation, as illustrated in FIG. 4, to more efficiently utilize the space within the outer housing of relay 74. Alternatively, the three printed circuit boards 26 can be combined as a single printed circuit board to which the three cores 24 and three sensors 22 are mounted. Another alternate arrangement is illustrated in FIG. 5 by phantom lines. In this configuration, one or more printed circuit boards 26 extend upwardly from an upper surface 76 of primary printed circuit board 28, and one or more printed circuit boards 26 extend downwardly from a lower surface 78 of primary printed circuit board 28.

Figure 6:
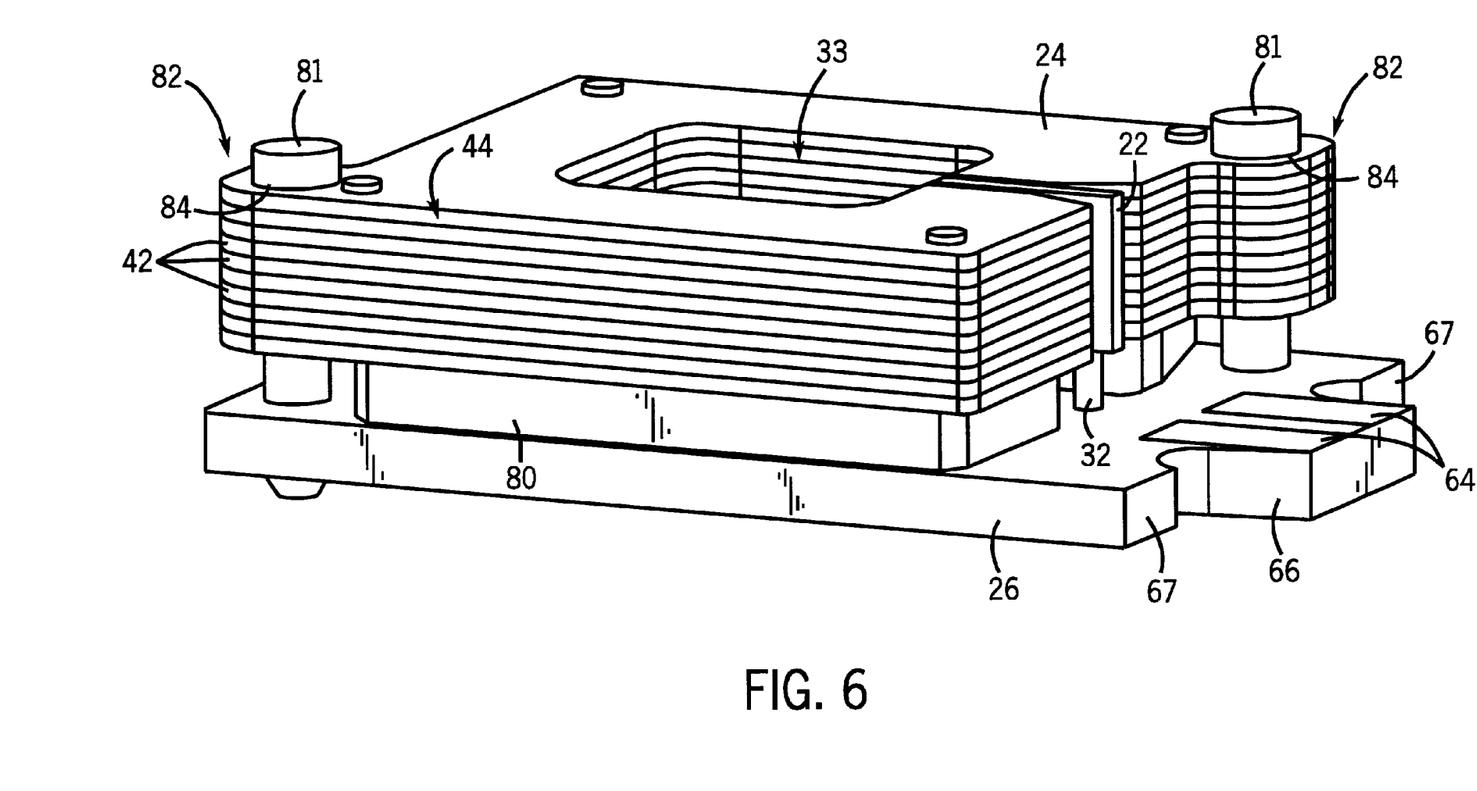
FIG. 6 is a perspective view of an alternate embodiment of the sensor system.

Referring generally to FIG. 6, an alternate embodiment of sensor system 20 is illustrated. In this embodiment, printed circuit board 26 retains tab 66 for insertion into primary printed circuit board 28 to form a board-in-board connection. However, core 24 is held to circuit board 26 at a predetermined, spaced distance from printed circuit board 26 via a spacer 80. A plurality of mounting pins, e.g. two mounting pins, ensure that spacer 80 remains sandwiched between core 24 and circuit board 26. Preferably, core 24 is similar in shape to that described with reference to FIGS. 1 through 3 and is comprised of laminations 42 to form lamination stack 44. The lamination stack 44 includes a pair of extended portions 82, each having an opening 84 therethrough to receive a corresponding pin 81. Pin 81 may comprise, for example, a rivet that is secured to printed circuit board 26. Spacer 80 maintains lamination stack 44 at the predetermined distance from printed circuit board 26.

Figure 7:
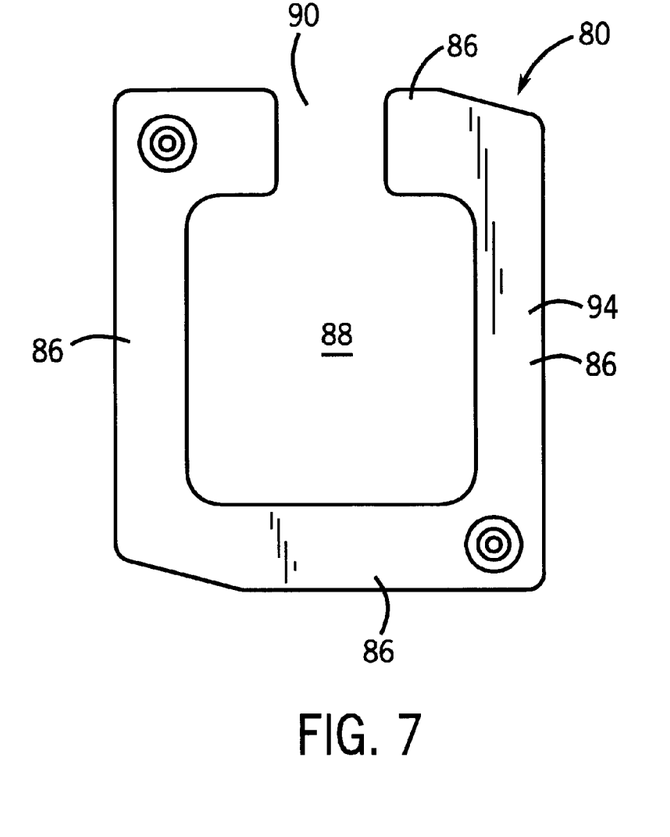
FIG. 7 is a front view of a spacer member illustrated in FIG. 6.
Figure 8:
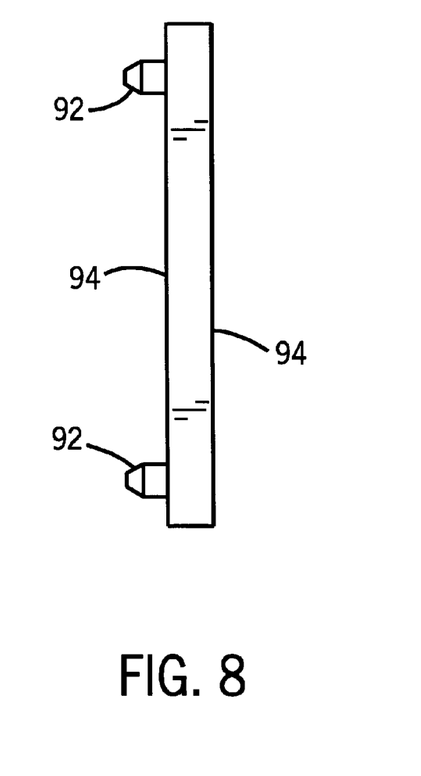
FIG. 8 is a side view of the spacer illustrated in FIG. 7.

As illustrated in FIGS. 7 and 8, spacer 80 may be generally a rectangular ring having four sides 86. Spacer 80 includes a central opening 88 to receive conductor 34 therethrough. Additionally, one of the sides 86 includes a gap 90 to accommodate Hall generator 22. Spacer 80 also may include a pair of protrusions 92 that extend from one of the generally flat mounting surfaces 94. Either the lamination stack 44 or printed circuit board 26, preferably printed circuit board 26, contains recesses sized to receive protrusions 92. Thus, spacer 80 is securely held in place between lamination stack 44 and printed circuit board 26 when assembled. The lamination stack 44 preferably is grounded and may be grounded through one of the pins 81 as described with reference to FIG. 3 above.

Figure 9:
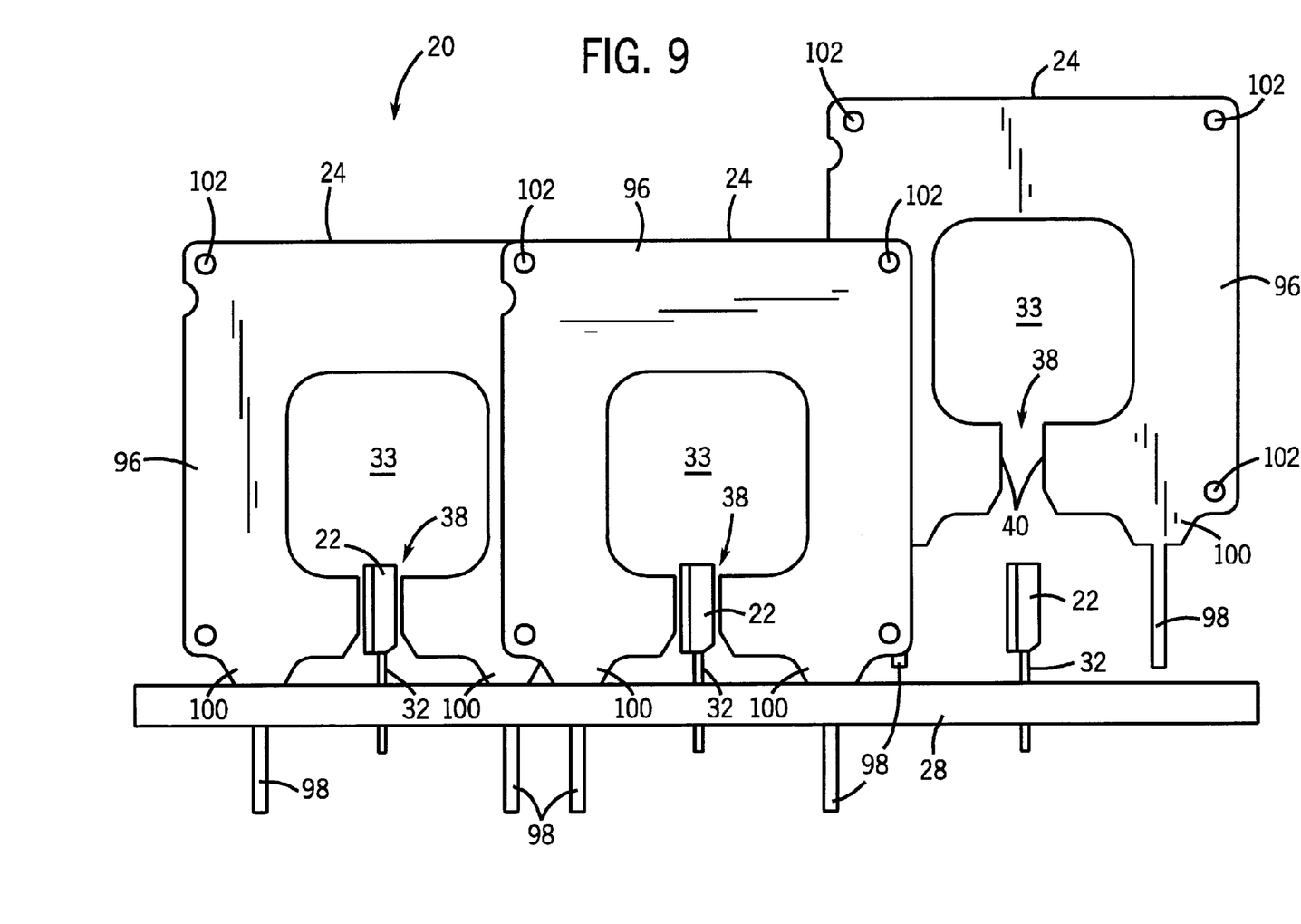
FIG. 9 is a front view of an alternate embodiment of the system illustrated in FIG. 4.
Figure 10:
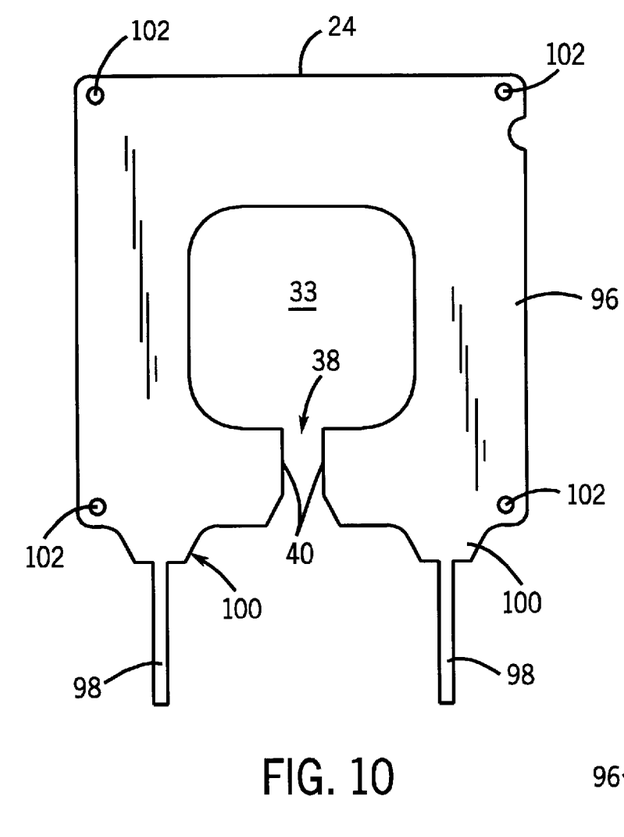
FIG. 10 is a front view of an individual alternate core of the type illustrated in FIG. 9.
Figure 11:
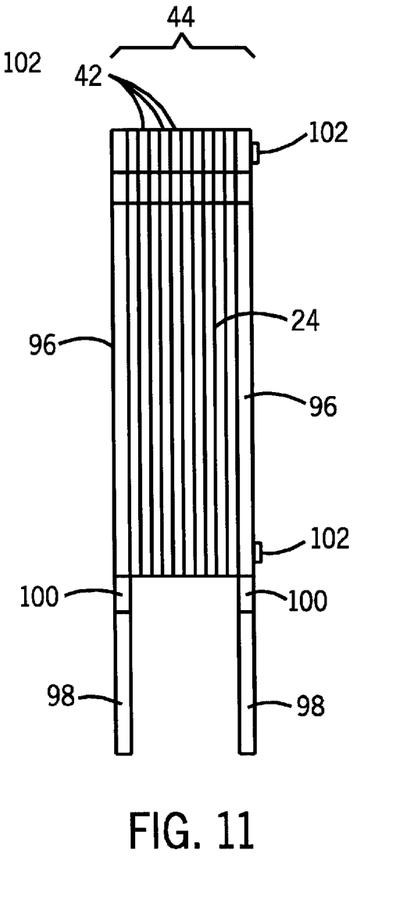
FIG. 11 is a side view of the core illustrated in FIG. 10.

Referring generally to FIGS. 9 through 11, another alternate embodiment of system 20 is illustrated. In this system, each core 24 and each Hall generator 22 is directly connected, mechanically and electrically, to primary printed circuit board 28. In this embodiment, each core 24 is formed as a lamination stack 44. However, the lamination stack includes at least one and preferably two mounting laminations 96 that have mounting legs 98. Each mounting lamination 96 includes a pair of mounting legs 98, and each mounting leg 98 is connected to the remainder of the core through a standoff 100. Standoffs 100 maintain each core 24 at a predetermined distance from primary printed circuit board 28 to permit centering of Hall generator 22 between core end surfaces 40.

The lamination stack may be held together by a plurality of retention pins 102, e.g. four retention pins 102, as illustrated best in FIG. 10. Preferably, mounting legs 98 are soldered to primary printed circuit board 28 to secure cores 24 in their appropriate locations and in their appropriate orientations, i.e., generally perpendicular to circuit board 28. One or more mounting legs 98 also can be soldered to a circuit ground on circuit board 28 to further eliminate the effects of electrical noise on conductor 34. To ensure proper grounding and a durable soldered connection, it may be necessary to coat one or more mounting legs 98 with an appropriate conductive material.

Figure 12:
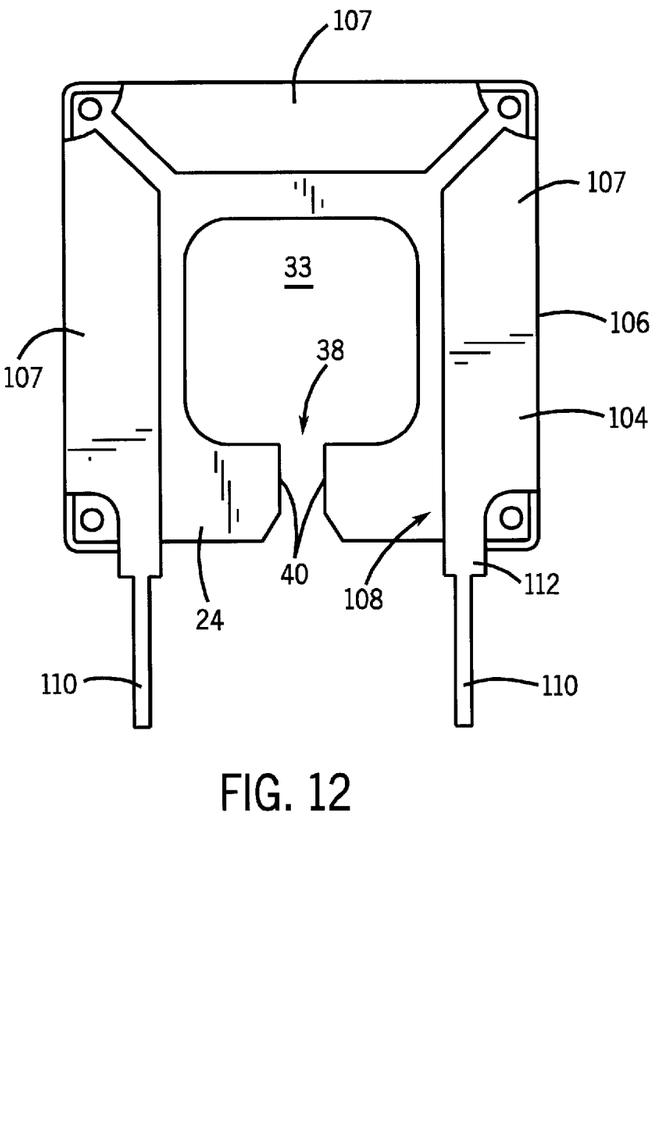
FIG. 12 is a front view of another alternate embodiment of the core.
Figure 13:
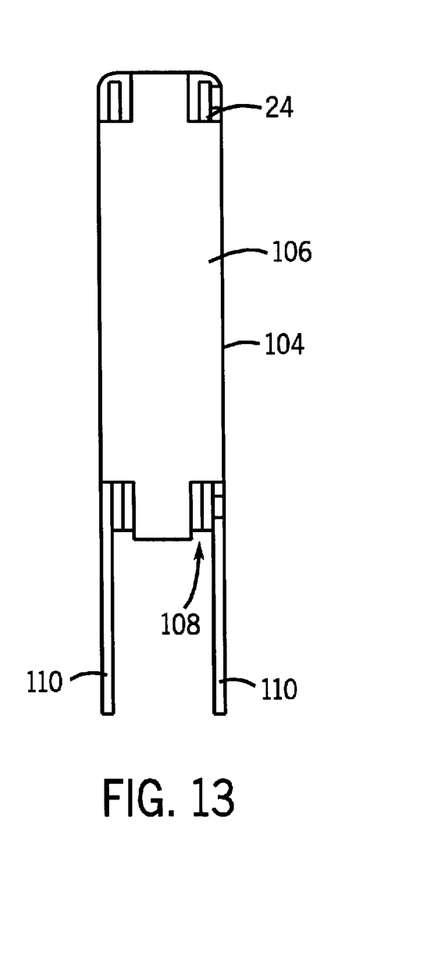
FIG. 13 is a side view of the core illustrated in FIG. 12.

Referring generally to FIGS. 12 and 13, another alternate embodiment of core 24 is illustrated. In this embodiment, a lamination stack 44 is held within a formed channel carrier 104. Channel carrier 104 preferably is made from a sheet metal material that includes an outer perimeter section 106 and a plurality of flaps 107 that are folded inwardly from outer perimeter section 106 to form an interior channel 108. Interior channel 108 is sized to receive and hold a lamination stack 44.

The channel carrier 104 further includes a plurality of mounting legs 110 that are connected to appropriate flaps 107 via standoffs 112. Mounting legs 110 are designed for direct engagement with primary printed circuit board 28, as described with respect to FIGS. 9 through 11. As described above, the core may be grounded to primary printed circuit board 28 via one or more legs 110. However, it may be desirable to plate the one or more mounting legs 110 with a conductive material that facilitates soldering of channel carrier 104 to primary printed circuit board 28 and that ensures an electrically conductive connection therebetween.

Figure 14:
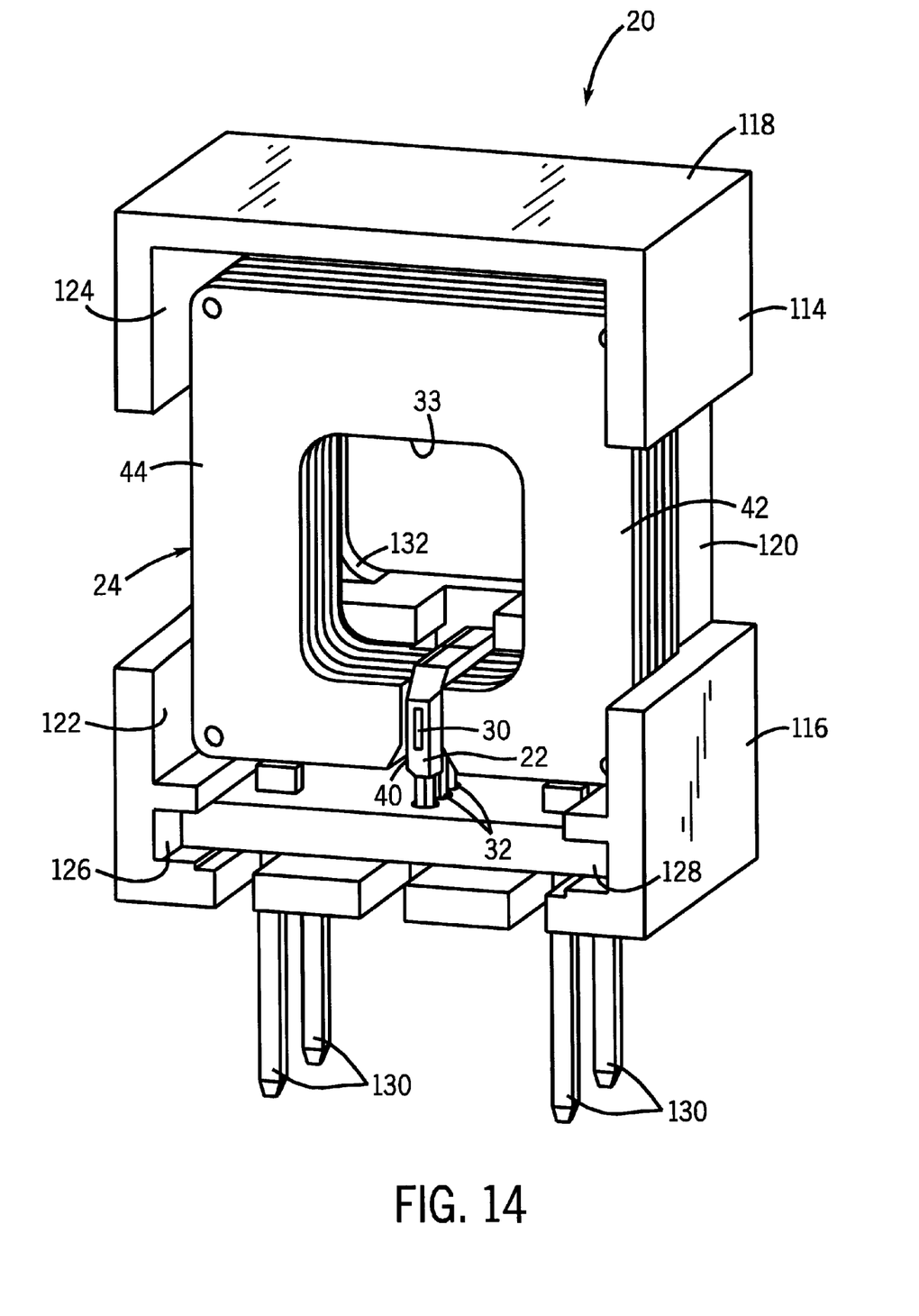
FIG. 14 is a perspective view of another alternate embodiment of the system illustrated in FIG. 1.

Referring generally to FIG. 14, another embodiment of system 20 is illustrated. In this embodiment, lamination stack 44 is securely held within a plastic carrier 114. Plastic carrier 114 includes a base portion 116, a top portion 118, and a back portion 120 that connects base portion 116 and top portion 118. Base portion 116 includes a slot area 122 to slidingly receive the lower portion of lamination stack 44. Similarly, top portion 118 includes an interior slot area 124 for receiving the top portion of lamination stack 44. Lamination stack 44 may be secured within plastic carrier 114 by a variety of acceptable mechanisms, such as epoxy, snaps, interference fit etc.

Beneath slot area 122, base portion 116 includes a circuit board slot 126 in which a printed circuit board 128 is received. A plurality of plated pins 130 extend through printed circuit board 128 and downwardly for engagement with primary circuit board 28 (not shown). Hall generator 22 also is connected to printed circuit board 128 via leads 32. Potentially, leads 32 may be electrically connected with primary printed circuit board 28 either directly or through pins, such as plated pins 130.

In this embodiment, lamination stack 44 and Hall generator 22 are disposed generally perpendicular to primary printed circuit board 28, as with the embodiments described above. However, printed circuit board 128 lies generally parallel with primary printed circuit board 28 when assembled. Thus, conductor 34 lies generally parallel with primary printed circuit board 28 when it is disposed through central opening 33 of lamination stack 44 and through corresponding carrier opening 132 formed in back portion 120.

If electrical noise immunity is an issue, a bond wire can be soldered from the lamination stack 44 to the primary printed circuit board 28 to allow grounding of the core. Alternatively, mounting feet may be incorporated with the lamination stack, as described above, such that the lamination stack can be directly soldered to the primary printed circuit board and connected to a circuit ground.

It will be understood that the foregoing description is of a preferred exemplary embodiment of this invention and that the invention is not limited to the specific forms shown. For example, the core may have a variety of configurations and sizes including rounded or beveled lead-in surfaces and interlocking dimples to help hold the laminations together, at least during manufacture; the Hall generator preferably is centered with respect to the core faces and oriented generally perpendicular with respect to the conductor, but those parameters may be altered; the materials utilized in forming the conductor, the core and the circuit boards may be varied depending on the specific application; a wide variety of primary printed circuit boards may be utilized depending on the specific application and environment in which the sensor system is utilized; and the sensor systems may be combined with a variety of other features within a given component. Additionally, the recitation of locational terminology, such as upper, lower, rear, front, top and bottom are merely for descriptive purposes and should not be construed as limiting with respect to the orientation of the components described. These and other modifications may be made in the design and arrangement of the elements described above without departing from the scope of the invention as expressed in the appended claims.

What is claimed is:

1. A Hall effect current sensor system, comprising:

a Hall generator;

a core having central opening sized to receive a current conductor therethrough, and a gap sized to receive the Hall generator;

a first printed circuit board to which the Hall generator and the core are mounted, the first printed circuit board having an opening to receive the conductor therethrough, the core being mounted to the first printed circuit board by a plurality of pins and separated from the first printed circuit board by a predetermined distance; and a second printed circuit board to which the first printed circuit board is electrically and physically connected such that an axis of the central opening is generally parallel with the second printed circuit board, herein the predetermined distance is established by a spacer independent of the plurality of pins.

2. The Hall effect current sensor system as recited in claim 1, wherein the core comprises a lamination stack.

3. The Hall effect current sensor system as recited in claim 1, wherein the core is separated from the second printed circuit board.

4. The Hall effect current sensor system as recited in claim 1, wherein the core is electrically grounded to the second printed circuit board.

5. The Hall effect current sensor system as recited in claim 1, wherein the Hall generator includes a Hall plate disposed between a pair of core faces that define the gap, the Hall plate being generally centered with respect to the pair of core faces.

6. The Hall effect current sensor system as recited in claim 1, wherein the first printed circuit board is connected to the second circuit board by a board-in-board connection.

* * * * *